(12) United States Patent
Razavi et al.

(10) Patent No.: US 11,449,645 B2
(45) Date of Patent: Sep. 20, 2022

(54) CALIBRATING A DIVERSION MODEL FOR A HYDRAULIC FRACTURING WELL SYSTEM

(71) Applicant: Halliburton Energy Services, Inc., Houston, TX (US)

(72) Inventors: Seyed Omid Razavi, Houston, TX (US); Joshua Camp, Friendswood, TX (US); Tirumani N. Swaminathan, Houston, TX (US); Baidurja Ray, Jersey Village, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 370 days.

(21) Appl. No.: 16/564,937

(22) Filed: Sep. 9, 2019

(65) Prior Publication Data

US 2021/0073342 A1 Mar. 11, 2021

(51) Int. Cl.
*G06F 30/00* (2020.01)
*G06F 17/18* (2006.01)
(Continued)

(52) U.S. Cl.
CPC ............ *G06F 30/00* (2020.01); *E21B 43/267* (2013.01); *E21B 47/06* (2013.01); *E21B 47/10* (2013.01);
(Continued)

(58) Field of Classification Search
CPC ...... E21B 47/06; E21B 2200/20; E21B 47/10; E21B 49/00; E21B 43/267; G01N 15/0826; G06F 17/18; G06F 30/00
See application file for complete search history.

(56) References Cited

U.S. PATENT DOCUMENTS

| 4,749,038 A | * | 6/1988 | Shelley | ................. | E21B 49/008 |
| | | | | | 166/250.1 |
| 7,451,812 B2 | | 11/2008 | Cooper et al. | | |

(Continued)

FOREIGN PATENT DOCUMENTS

| EP | 2486228 B1 * | 7/2018 | ........... E21B 49/006 |
| WO | 2018022045 A1 | 2/2018 | |

(Continued)

OTHER PUBLICATIONS

Massaras, et al.; "Enhanced Fracture Entry Friction Analysis of the Rate Step-down Test"; SPE International; SPE 106058; 2007; 16 pgs.

(Continued)

*Primary Examiner* — Chuen-Meei Gan
(74) *Attorney, Agent, or Firm* — John W. Wustenberg; Parker Justiss, P.C.

(57) ABSTRACT

The disclosure presents a process for calibrating a diversion model for a treatment stage of a hydraulic fracturing well site. The process can pump a portion of the proppant into the wellbore, flush the wellbore with clean HF fluid, and then perform a diagnostic test to determine a near-wellbore (NWB) flow resistance parameter. Next, diverter material can be distributed into the wellbore and the amount of diverter material delivered to each active perforation cluster can be estimated. A second diagnostic test can be performed followed by computing diversion model parameters such as a near-wellbore zone length parameter for perforation clusters capable of receiving HF fluid. In another aspect, a system is disclosed that can direct operations of a well site pump and collect data from surface and downhole diagnostic sensors, and then use the collected data for the diversion model calibration process.

24 Claims, 5 Drawing Sheets

(51) Int. Cl.
*E21B 43/267* (2006.01)
*E21B 47/10* (2012.01)
*E21B 47/06* (2012.01)
*E21B 49/00* (2006.01)

(52) U.S. Cl.
CPC .............. *E21B 49/00* (2013.01); *G06F 17/18* (2013.01); *E21B 2200/20* (2020.05)

(56) References Cited

U.S. PATENT DOCUMENTS

| | | | |
|---|---|---|---|
| 7,516,793 | B2 | 4/2009 | Dukstra |
| 8,950,482 | B2 | 2/2015 | Hill et al. |
| 9,090,810 | B2 * | 7/2015 | Bour ...................... C09K 8/508 |
| 9,140,109 | B2 | 9/2015 | Suarez-Rivera et al. |
| 9,416,644 | B2 | 8/2016 | Mcewen-King et al. |
| 9,617,848 | B2 | 4/2017 | Hill et al. |
| 9,719,340 | B2 * | 8/2017 | Scharmach ........... E21B 43/267 |
| 9,803,457 | B2 * | 10/2017 | Shampine ............... E21B 43/26 |
| 9,938,815 | B2 | 4/2018 | Samuel et al. |
| 9,945,374 | B2 | 4/2018 | Stephenson ............. F04B 49/22 |
| 2008/0133193 | A1 * | 6/2008 | Gdanski .................. E21B 49/08 703/10 |
| 2011/0162849 | A1 * | 7/2011 | Soliman ............. G01N 15/0826 166/308.1 |
| 2014/0222405 | A1 * | 8/2014 | Lecerf ..................... E21B 43/26 703/10 |
| 2015/0075777 | A1 * | 3/2015 | Walters ................... E21B 47/06 166/250.1 |
| 2016/0069182 | A1 * | 3/2016 | Neale ...................... E21B 47/16 166/254.2 |
| 2016/0115771 | A1 * | 4/2016 | Ganguly ................. E21B 49/00 703/10 |
| 2017/0067335 | A1 * | 3/2017 | Weng ...................... E21B 47/10 |
| 2018/0238169 | A1 | 8/2018 | Sun et al. |
| 2020/0291774 | A1 * | 9/2020 | Balan .................... G01V 99/005 |

FOREIGN PATENT DOCUMENTS

| | | | | |
|---|---|---|---|---|
| WO | WO-2018022044 | A1 * | 2/2018 | ......... E21B 41/0092 |
| WO | 2018048415 | A1 | 3/2018 | |
| WO | WO-2018084871 | A1 * | 5/2018 | ......... E21B 41/0092 |
| WO | 2018160171 | A1 | 9/2018 | |
| WO | 2018160183 | A1 | 9/2018 | |

OTHER PUBLICATIONS

Romero, et al.; Theoretical Model and Numerical Investigation of Near-Wellbore Effects in Hydraulic Fracturing; SPE Prod. & Facilities 15(2); SPE 63009; May 2000; 7 pgs.

Cleary, et al.; "Field Implementation of Proppant Slugs To Avoid Premature Screen-Out of Hydraulic Fractures With Adequate Proppant Concentration"; Society of Petroleum Engineers; SPE 25892; SPE Rocky Mountain Regional/Low Permeability Reservoirs Symposium, Apr. 12-14, 1993; 16 pgs.

\* cited by examiner

CALIBRATING A DIVERSION MODEL FOR A HYDRAULIC FRACTURING WELL SYSTEM

TECHNICAL FIELD

This application is directed, in general, to determining a treatment stage plan for a hydraulic fracturing well system and, more specifically, to determining the impact of diverter material on the allocation of downhole material among perforation clusters.

BACKGROUND

In hydraulic fracturing well systems, treatment stages are used to implement part of a well site operation plan. The treatment stage can pump various types of downhole materials, such as fluids, solids, proppants, chemicals, diverter material, and other material into a wellbore of the well site to aid in the hydraulic fracturing operations. The effectiveness of the material pumped into the wellbore can vary due to the subterranean formation properties and the downhole material properties.

One factor of the effectiveness can be the distribution of the downhole material among the active perforation clusters and fractures. Diverter material can be used to modify the distribution of the downhole material such as to allow for more uniform distribution of fracturing materials between different clusters. Lower fracture efficiency can be caused by lower resistance against the HF fluid flow rate in one or more of the fractures within the treatment stage.

The lower HF fluid flow resistance can result in that fracture receiving a larger portion of the total HF fluid, and thereby an unbalanced growth of fractures can occur. Diversion treatments can result in an improvement of the fracture efficiency within wellbores. The improvement can be due to a larger amount of diverter material accumulating in the fracture with the lower HF fluid flow resistance. The diverter material can result in an increased HF fluid flow resistance, and thereby cause an improvement to the HF fluid flow distribution balance among fractures.

Typically, the appropriate execution of a diversion treatment has been arrived at through successive trial and error experiments. Once a satisfactory solution has been determined, going forward, the satisfactory solution is utilized. However, performing the same diversion treatment across all wells, and even across all treatment stages on the same well, is suboptimal. Customization of the treatment stage can further improve cluster efficiency over the status quo.

SUMMARY

In one aspect, a method to calibrate a diversion model for a treatment stage of a hydraulic fracturing (HF) well site is disclosed. In one embodiment, the method includes: (1) pumping a portion of a proppant amount into a wellbore of the HF well site, using a plan for the treatment stage, (2) performing a first diagnostic test to determine a first near-wellbore (NWB) flow resistance parameter for each of one or more active perforation clusters, using a HF fluid pressure variation and a HF fluid flow rate variation for each of the active perforation clusters, (3) estimating an amount of a diverter material distributed to each of the active perforation clusters using a quantity of a carrier fluid received at each of the respective active perforation clusters, wherein the carrier fluid carries the diverter material and is pumped into the wellbore, and (4) computing a diversion model parameter of a NWB zone for each of the active perforation clusters using the respective first NWB flow resistance parameter and a corresponding second NWB flow resistance parameter, wherein each of the corresponding second NWB flow resistance parameters are derived from a second diagnostic test.

In a second aspect, a system to calibrate a diversion model for a treatment stage of a HF well site is disclosed. In one embodiment, the system includes: (1) a downhole diagnostic sensor, operable to collect one or more of a HF fluid pressure parameter and a HF fluid flow rate parameter, and located in the HF well site, and (2) a diversion model calibrator, operable to compute a NWB length of a perforation cluster in the wellbore using parameters received from the downhole diagnostic sensor, provide pumping parameters where the pumping parameters utilize a diverter schedule, and calibrate the diversion model using each NWB length.

In a third aspect, a computer program product having a series of operating instructions stored on a non-transitory computer-readable medium that directs a data processing apparatus when executed thereby to perform operations to calibrate a diversion model for a treatment stage of a HF well site is disclosed. In one embodiment, the operations include: (1) directing a pump system to pump a portion of a proppant amount into a wellbore of the HF well site, using a plan for the treatment stage, (2) determining a first NWB flow resistance parameter using a result of a first diagnostic test, for each of one or more active perforation clusters, using a HF fluid pressure variation and a HF fluid flow rate variation for each of the active perforation clusters, (3) estimating an amount of a diverter material distributed to each of the active perforation clusters using a quantity of a carrier fluid received at each of the respective active perforation clusters, wherein the carrier fluid carries the diverter material and is pumped into the wellbore, and (4) computing a diversion model parameter of the NWB zone for each of the active perforation clusters using the respective first NWB flow resistance parameter and a corresponding second NWB flow resistance parameter, wherein each of the corresponding second NWB flow resistance parameters are derived from a second diagnostic test.

BRIEF DESCRIPTION

Reference is now made to the following descriptions taken in conjunction with the accompanying drawings, in which.

DETAILED DESCRIPTION

In hydraulic fracturing (HF) well systems, a downhole material distribution process is often utilized to develop the HF well site. The downhole material, i.e., HF fluid with or without added components, can be one or more of various types of materials, i.e., additives, distributed within a wellbore of the well site, for example, slurry, oil-based fluids, water-based fluids (such as various types of brine), wellbore muds, gaseous fluids (such as air or other gases, by itself or combined with water, polymers, and other additives), proppants, chemicals, solids (such as low gravity and high gravity solids), diverter material, carrier fluid, and a combination thereof. The downhole material can be used to aid in fracturing the subterranean formation, extracting hydrocarbons from the wellbore, and other well site operations.

To develop a HF well site, a target downhole material distribution can be set as the target for a HF treatment stage. The distribution can include an amount of one or more of the types of downhole material distributed to one or more targeted active perforation clusters and to one or more of the active fracture. An active perforation cluster is a perforation cluster located along a fluid pipe inserted into the wellbore, which is being utilized during the treatment stage, and where the perforation cluster can take HF fluid and other downhole material, e.g., allow HF fluid and downhole material to pass through into the subterranean formation. Certain perforation clusters may be deactivated or unused, for example, closing a valve, being clogged, or otherwise not being used by the treatment stage. Proximate each active perforation cluster can be zero or more fractures, or clusters of fractures, of the subterranean formation, collectively identified as fractures. An active fracture is one that can receive HF fluid and other pumped downhole material.

A pumping plan for pumping, e.g., distributing, the downhole material can utilize a predictive model of the wellbore environment. The pumping plan can be implemented in the current treatment stage or a future treatment stage and include, over the pumping plan time interval, the HF fluid flow rates, concentration of additives, and the timing of adding the additives to the HF fluid.

Diverter material can be utilized to modify how the downhole material is distributed among the active perforation clusters, of which there can be one or more that are active in the wellbore for a particular treatment stage. Diverter material includes various types of diverter agents that impact fluid flow distribution among perforation clusters. Non-limiting examples of the diverter agent include particulate diverter, diverter pods, and fiber-based diverters. Diverter material can collect at a high flow rate active perforation cluster effectively causing a partial blockage of the active perforation cluster. This can lead to the low flow rate active perforation cluster receiving a higher percentage of the pumped downhole material. Improving the efficiency of fracturing fractures can be achieved by diverting the downhole material to low absorption fractures from high absorption fractures, e.g., moving towards a more balanced downhole material absorption by all of the active fractures.

As a well site is developed, the fracture absorption parameters can change during a treatment stage and across treatment stages, therefore, changes to a diverter schedule may be beneficial to improving the fracture efficiency. The diverter schedule is the collection of specified diverter profile parameters, such as the amount of diverter material, the type of diverter material, the concentration of diverter material, the timing of the drop of diverter material, the intended seating rate of diverter material, a timing of subsequent drops of diverter material, and other diverter schedule parameters. The diverter schedule can be modified throughout the treatment stage to improve the cluster efficiency, e.g., moving toward a more balanced absorption rates across all active fractures, for example, by creating more uniform fractures. The diverter schedule and the planned modifications to the diverter schedule are used as inputs to a diversion model.

The diversion model can be implemented by a pump system located at the well site. The pump system can be directed by the diversion model, such as being enabled or executed by a well site controller or other well site equipment, and the pump system can be directed by a computer system. The pump system, in conjunction with a broader treatment stage plan, can adjust the amount, concentration, and timing of the various downhole material components, as well as change the combination and percentages of each downhole material component, in order to improve the efficiency of the fracturing process within the wellbore of the well site.

This disclosure utilizes collected information from surface and downhole diagnostic sensors in combination with a controlled test using a specified amount of diverter material to determine the efficiency of the diversion schedule in order to calibrate the diversion model. In turn, the diversion model can be utilized to enable real-time or near real-time control of fracturing operations through diversion, such as when combined with a process that can predict downhole material placement in the fractures. The surface and downhole diagnostic sensors can measure and collect data on fluid and other pressures, fluid flow rates and composition, acoustic signatures, and other sensor data related to the well system operation such as temperature and chemical composition of surrounding subterranean formations.

The controlled tests can be executed more than once, varying the input parameters, and the best fit diversion model can be selected and utilized further. The best fit criteria can be determined by the targeted goals of the treatment stage and can included one or more of cost, ease of implementation, available equipment and materials, speed of reaching a fracturing goal, and other well site goals. The results of the controlled tests can be interpreted automatically, such as by a well site controller, or a well site engineer or operator can use the results to modify the diversion model used for the treatment stage. In some aspects, the controlled test results can be generated in real-time or near real-time at periodic intervals, or on demand, such as by a well site operator or engineer. In addition, the controlled test can be generated in one or more subsequent treatment stages.

The controlled tests can determine the impact of diversion on downhole material transport to different fractures in an execution of a treatment stage plan. The process utilizes a predictive model developed to characterize the impact of diversion on inducing resistance in different fractures. The predictive model can determine one or more diversion model parameters, such as a near-wellbore (NWB) dimension parameter (e.g., a NWB zone length parameter ($L_{NWB}$), which is a well constant, e.g., not changing between different treatment stages or different fractures), formation elastic parameters (e.g., Young's modulus and Poisson's ratio), and NWB flow resistance parameters (e.g., tortuosity parameters). The controlled test outlines an approach to estimating the $L_{NWB}$, and thereby calibrating the diversion model using the $L_{NWB}$. The diversion model, after calibration, can be utilized to direct a pump system thereby to effectively impact the NWB flow resistance parameter of each fracture with the goal to improve the fracture efficiency and to meet the treatment stage goal.

The process can utilize conventional diagnostic tests to determine the NWB flow resistance parameters, such as a HF fluid flow rate step test, a mini-frac test, a diagnostic fracture injection test, and other conventional diagnostic tests. For example, the HF fluid flow rate step test can characterize the measured total system friction into different HF fluid pressure loss components. The HF fluid flow rate step test is typically performed by pumping a small amount of HF fluid with a series of abrupt and closely spaced HF fluid flow rate values as measured at the surface. In field applications, this process is typically performed by a number of consecutively reduced steps in the HF fluid flow rate in a process known as the rate step-down test, though the HF fluid flow rates can be increased or decreased when performing the test. In other aspects, the process can monitor variations in HF fluid pressure and variations in HF fluid flow rates using any combination of distinct surface HF fluid flow rates.

The HF fluid pressure may be measured using one or more of surface and bottom-hole HF fluid pressure gauges. Next, the HF fluid pressure at each active perforation cluster can be determined by incorporating the impact of friction pressure loss and hydrostatic pressure along the distance between the pressure gauge and the corresponding active perforation cluster. The value of the HF fluid flow rate into the active perforation cluster can be determined using one or more diagnostic sensors, such as a surface sensor, for example, a surface HF fluid flow rate gauge, and a downhole sensor, for example, a distributed acoustic sensing (DAS) device, downhole gauges, and other downhole sensors.

Analyzing the variation of the HF fluid pressure parameter and the HF fluid flow rate parameter at the active perforation cluster yields the HF fluid pressure loss characteristics of the bottom-hole HF fluid pressure components for each active perforation cluster. These components include HF fluid pressure drop at the perforation, HF fluid pressure drop at the NWB zone, HF fluid pressure loss at the fracture proximate the active perforation cluster, and the minimum rock in-situ stresses. Assuming that the value of the HF fluid pressure loss at the fracture is negligible compared to the HF fluid pressure loss at the active perforation cluster and the NWB zone, the value of the bottom-hole HF fluid pressure at the active perforation cluster can be represented by Equation 1.

Equation 1: Example Bottom-Hole HF Fluid Pressure Algorithm $$P_{BH,i} = \beta_{perforation,i} q_i^2 + \alpha_{tort,i} \sqrt{q_i} + S_{hmin,i}$$

where $P_{BH}$ is the bottom-hole HF fluid pressure at the entrance of active perforation cluster I;

$q_i$ is the HF fluid flow rate at active perforation cluster i;

$\beta_{perforation,i}$ is the perforation friction parameter at active perforation cluster i;

$\alpha_{tort,i}$ is the tortuosity parameter (NWB flow resistance parameter) for fracture i;

$S_{hmin,i}$ is the minimum in-situ stress at fracture i;

$\beta_{perforation,i} q_i^2$ represents the active perforation cluster HF fluid pressure drop; and $\alpha_{tort,i} \sqrt{q_i}$ represents the tortuosity HF fluid pressure drop at fracture i.

There are three unknowns in Equation 1 for each cluster, $\beta_{perforation,i}$, $\alpha_{tort,i}$, and $S_{hmin,i}$. Thereby, when the values of $P_{BH,i}$ are determined at three distinct values of $q_i$, the values of the three unknowns can be determined. Therefore, the HF fluid flow rate step test requires pumping the HF fluid at three different surface HF fluid flow rates. In an alternate aspect, more than three distinct HF fluid flow rates can be utilized for the HF fluid flow rate step test. Using the additional HF fluid flow rates can improve the accuracy of the estimations of the unknown parameters.

In addition, in some aspects, the HF fluid flow rate step test can be performed using clean HF fluid, e.g., without proppant, chemicals, solids, and other additives. Utilizing clean HF fluid can avoid changing the value of the perforation friction due to sand erosion and other measurement interferences. In alternate aspects, the tortuosity parameters can be determined using a mini-frac test or a diagnostic fracturing injection test.

The diversion model can utilize a physics-based model where the impact of the diverter material can be represented by a change in the tortuosity parameter for the fracture. Equation 2 shows an example algorithm using the physics-based model.

Example change in tortuosity parameter using the physics-based model $$\alpha_{tort,AD,i} = \frac{\alpha_{tort,BD,i}}{1 - \sqrt{\frac{\pi(1-v^2)}{64 \rho E \rho_{diverter}^2 L_{NWB}^3} \alpha_{tort,BD,i} \, m_{diverter,i}}} \quad \text{Equation 2}$$

where $\alpha_{tort,BD,i}$ is the tortuosity parameter before diversion at fracture i;

$\alpha_{tort,AD,i}$ is the tortuosity parameter after diversion at fracture i;

E is Young's modulus of the subterranean formation at the fracture;

v is Poisson's ratio of the subterranean formation at the fracture;

μ is the viscosity of the HF fluid;

$\rho_{diverter}$ is the bulk density of diverter material; and $m_{diverter,i}$ is the amount of diverter material carried to active perforation cluster i.

The viscosity of the HF fluid and the density of the diverter material are known from the type of HF fluid and diverter material used. The value of elastic moduli (Young's modulus E, and Poisson's ratio v) can be determined using formation evaluation techniques, for example, using sonic wireline logging or testing core samples collected within or proximate the well site.

The amount of diverter material distributed to each of the active perforation clusters can be determined using the quantity of carrier fluid, e.g., any HF fluid that carries the diverter material, received at each of the respective active perforation clusters. This measurement can be conducted through a variety of conventional fracturing diagnostic methods. The tortuosity parameter before and after the diversion process can be determined by conducting one or more of the diagnostic tests. $L_{NWB}$ is the length parameter and can be primarily affected by the in-situ earth stress, borehole orientation, fracture toughness of the formation, and the completion design of the fractures. The $L_{NWB}$ remains relatively constant across different stages of the wellbore.

The process of calibrating the diversion model can utilize the following steps. First, a portion of the planned proppant amount can be pumped into the wellbore. The planned proppant amount can be determined by the treatment stage plan. The amount of proppant pumped can vary, such as from 20.0% to 70.0% of the total proppant amount specified in the treatment stage plan, with 30.0% being a typical targeted amount, though the actual percentage of proppant used can vary outside of this range. Within the wellbore, pumping proppant can result in sand erosion and other wellbore detriments of the HF fluid path within the fractures. These detriments can lead to enlargement of the flow channel in the fractures and the perforation friction parameter, and thereby the overall effectiveness of the diversion treatment. Therefore, the portion of planned proppant pumped into the wellbore should be sufficient to enable a reliable estimate of the rate of sand erosion in each active perforation cluster.

Second, the wellbore, in the area of interest, or a larger area, such as the entire wellbore, can be flushed with clean HF fluid. The flushing action can provide that the wellbore flow path is substantially free of proppant particles prior to performing the subsequent steps. Proppant particles may introduce variations to the tortuosity parameter due to potential sand erosion of fractures. Satisfaction of the substantially free of proppant particles constraint can be met when the amount of remaining proppant particles is small enough to avoid impacting, or negligibly impact, the measurements used for the computation of the tortuosity parameter.

An alternate aspect may be to use HF fluid mixed with proppant, and to correct the perforation friction parameter using appropriate erosion models. It should be noted that in this aspect the impact of proppant on the variation of the tortuosity parameter can be assumed to be negligible. When significant sand erosion is expected, the aspect can remain valid by utilizing a conventional method to modify the tortuosity parameter, effectively reducing variations due to the sand erosion.

Third, a diagnostic test, such as the HF fluid flow rate step test, can be performed to determine the tortuosity parameters for each of the active perforation clusters ($\alpha_{tort,BD,i}$). As described above, the HF fluid flow rate step test determines the variation in HF fluid flow rate and variation in bottom hole HF fluid pressure at each active perforation cluster using a minimum of three distinct surface HF fluid flow rates. In some aspects, clean HF fluid can be used to reduce errors in estimating the tortuosity parameters due to sand erosion during the test. In an alternate aspect, other processes for determining the tortuosity parameters for each of the active perforation clusters can be utilized.

Fourth, diverter material can be pumped into the wellbore. The diverter material can be carried through the fluid pipe inserted in the wellbore by a carrier fluid. The carrier fluid can be any HF fluid that does not contain proppant. The amount of diverter material can vary per the wellbore and subterranean formation characteristics, such as using 5.0 to 20.0 pounds of diverter material multiplied by the number of active perforation clusters, though the actual amount can vary outside of this range, for example, 100 pounds of diverter material can be used as an initial quantity. The amount of diverter material utilized can also be modified by the type and structure of the utilized diverter material. The amount can be determined by pumping enough diverter material into the wellbore to generate a measurable diversion response, as measured by the bottom hole HF fluid pressure and HF fluid flow rates, at each of the active perforation clusters. Too much diverter material can reduce the efficiency of the diverter transport to the fractures, such as by causing plugging of the surface fluid pipes, wellbore fluid pipes (such as perforation clusters), and other areas where the carrier fluid can carry the diverter material.

Fifth, the amount of diverter material distributed to each of the active perforation clusters can be estimated. The estimation algorithm can utilize the proportion of the total diverter material laden carrier fluid received by each active perforation cluster compared to the total carrier fluid volume combined with an appropriate model for the transport efficiency of the diverter material. For example, a transport efficiency model can utilize ideal transport efficiency, which allocates diverter mass to each fracture based on the proportion of the HF fluid flow intake by that fracture from the total pumped HF fluid flow rate. The estimation algorithm utilizes data collected by available surface and downhole diagnostic sensors, such as DAS and gauges, and utilizes specified parameters on the carrier efficiency of the carrier fluid with respect to the diverter material.

Sixth, a second diagnostic test, such as a second HF fluid flow rate step test, can be performed to determine the tortuosity parameter after the diversion treatment ($\alpha_{tort,AD,i}$) for each of the active perforation clusters. Similar to the first HF fluid flow rate step test, clean HF fluid and a minimum of three different HF fluid flow rates are utilized. In an alternate aspect, other processes for determining the tortuosity parameters for each of the active perforation clusters can be utilized.

Seventh, using a diversion model, for example, Equation 2, the $L_{NWB}$ can be computed using the first and corresponding second tortuosity parameters computed after each of the respective first and second HF fluid flow rate step tests, where the corresponding second tortuosity parameter is computed from the same active perforation cluster as the first tortuosity parameter.

Eighth, a statistical model can be utilized to combine the $L_{NWB}$ computed for each of the active perforation clusters. For example, an arithmetic mean of the computed $L_{NWB}$ in the active perforation clusters can be used as the $L_{NWB}$ for the diversion model. In an alternate aspect, median or closest match algorithms can be utilized comparing the $L_{NWB}$ from each active perforation cluster.

The computed $L_{NWB}$ for the wellbore can be used as input into the diversion model enabling a calibration of the diversion model. The calibrated diversion model can then be used to modify to the treatment stage plan or a future treatment stage plan, thereby improving that treatment stage efficiency at satisfying its targeted goal.

In an alternate aspect, the steps outlined above can be repeated one or more times within a treatment stage and can be repeated one or more times across more than one treatment stage. Typically, the controlled test process may utilize up to ten minutes to complete, though the actual execution time can vary shorter or longer with the wellbore, such as the length of the wellbore, the equipment used, and the diverter material used. In some aspects, some of the disclosure steps can be shared with other treatment stage processes. For example, flushing the wellbore prior to introducing diverter materials and reducing the rate for seating the diverter in the fracture are common to other diversion treatments.

In aspects where the steps are repeated, the $L_{NWB}$ parameters computed in each execution of the steps can be used collectively to determine the wellbore $L_{NWB}$ parameters for calibrating the diversion model. Each repeated set of steps can utilize the same or different diversion models, such as varying the diverter material concentration, the diverter material landing rate, the diverter material release timing, and the type or structure of the diverter material. The varied diversion models can improve the estimations for the $L_{NWB}$ parameters to increase the accuracy of the wellbore $L_{NWB}$ parameter.

Figure 1:
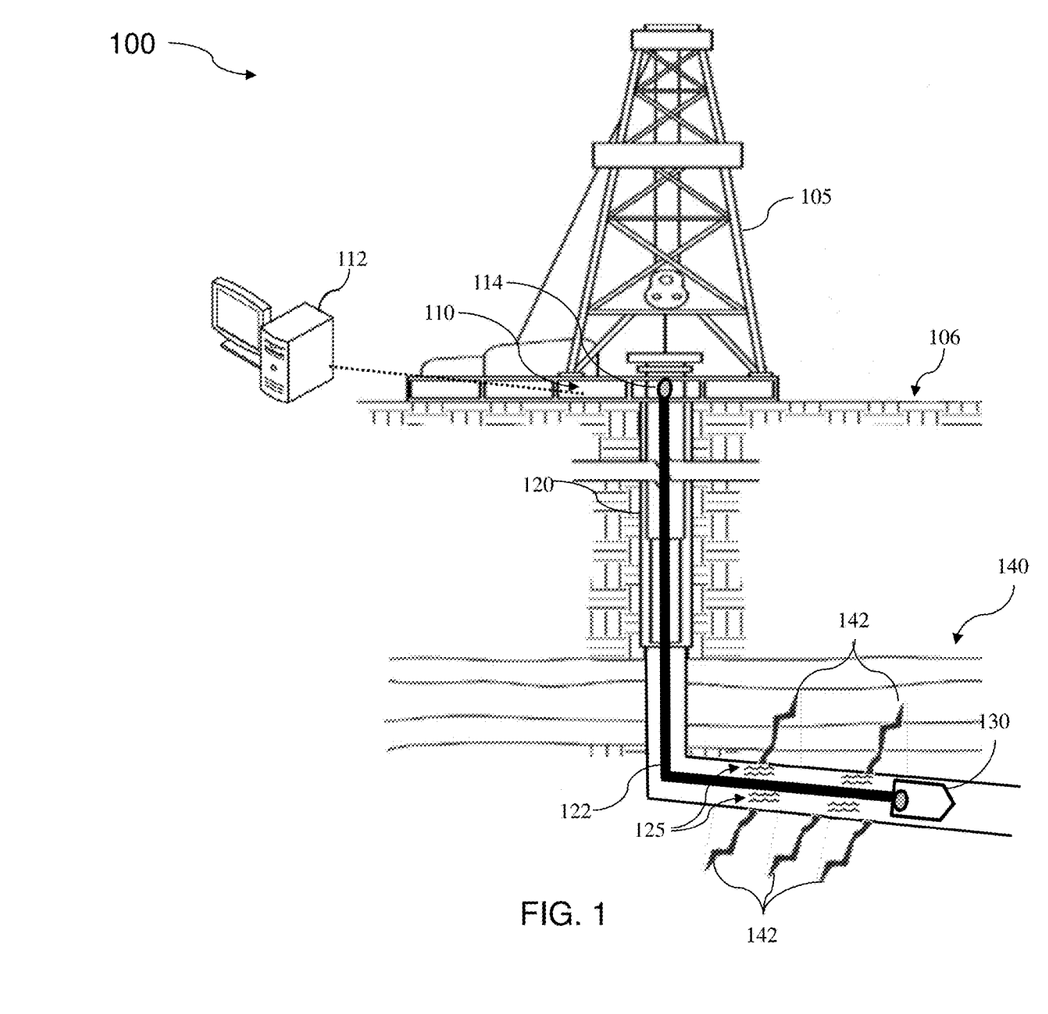
FIG. 1 is an illustration of a diagram of an example hydraulic fracturing (HF) well system.

Turning now to the figures, FIG. 1 is an illustration of a diagram of HF well system 100, which can be a well site where HF operations are occurring through the implementation of a HF treatment stage plan. HF well system 100 demonstrates a nearly horizontal wellbore undergoing a fracturing operation. Although FIG. 1 depicts a specific wellbore configuration, those skilled in the art will understand that the disclosure is equally well suited for use in wellbores having other orientations including vertical wellbores, horizontal wellbores, slanted wellbores, multilateral wellbores, and other wellbore types. FIG. 1 depicts an onshore operation. Those skilled in the art will understand that the disclosure is equally well suited for use in offshore operations.

HF well system 100 includes a surface well equipment 105 located at a surface 106, a well site control equipment 110, and a HF pump system 114. In some aspects, well site control equipment 110 is communicatively connected to a separate computing system 112, for example, a separate server, data center, cloud service, tablet, laptop, smartphone, or other types of computing systems. Computing system 112 can be located proximate to well site control equipment 110 or located a distance from well site control equipment 110, and can be utilized by a well system engineer and operator to review the diversion model stemming from the calibration process.

Extending below surface 106 from surface well equipment 105 is a wellbore 120. Wellbore 120 can have zero or more cased sections and a bottom section that is uncased. Inserted into the wellbore 120 is a fluid pipe 122. The bottom portion of fluid pipe 122 has the capability of releasing downhole material 125, such as carrier fluid with diverter material, from fluid pipe 122 to subterranean formations 140. The release of downhole material 125 can be by perforations in fluid pipe 122, by valves placed along fluid pipe 122, or by other release means. At the end of fluid pipe 122 is a bottom-hole assembly (BHA) 130, which can be one or more downhole tools or an end cap assembly.

In HF well system 100, fluid pipe 122 is releasing downhole material 125 into subterranean formation 140 at a determined HF fluid pressure and HF fluid flow rate. Downhole material 125 is being absorbed by, e.g., enter or flowing into, several fractures 142. Well site control equipment 110 can include a well site parameter collector that can collect sensor data from one or more diagnostic sensors proximate to the well site, located at a surface location, such as part of HF pump system 114, and located downhole within wellbore 120, such as a downhole HF fluid pressure gauge and a DAS. Well site control equipment 110 and computing system 112 can include a diversion model calibrator system capable of receiving the sensor data collected by the well site parameter collector, and capable of receiving the downhole data from surface and downhole diagnostic sensors, and capable to determine a calibrated diversion model, such as performing the controlled test process, using the predictive model of the wellbore, the treatment stage parameters, and the best fit diverter schedule.

The calibrated diversion model can be utilized as input into the treatment stage plan, such as for the pumping plan of the treatment stage. The insights gained from the calibration of the diversion model can be used by well site control equipment 110 to modify the treatment stage plan, such as adjusting the mass, frequency, and timing of release, of the diverter material and other downhole material.

In an alternative aspect, computing system 112 can be located a distance from HF well system 100, such as in a data center, server, or other system, and computing system 112 can be disconnected from HF well system 100. In this aspect, computing system 112 can receive the resulting parameters from the controlled tests, where the resulting parameters were collected by the other components of HF well system 100. The diversion model calibrator can be part of computing system 112 and can produce a calibration of the diversion model for the treatment stage.

Figure 2:
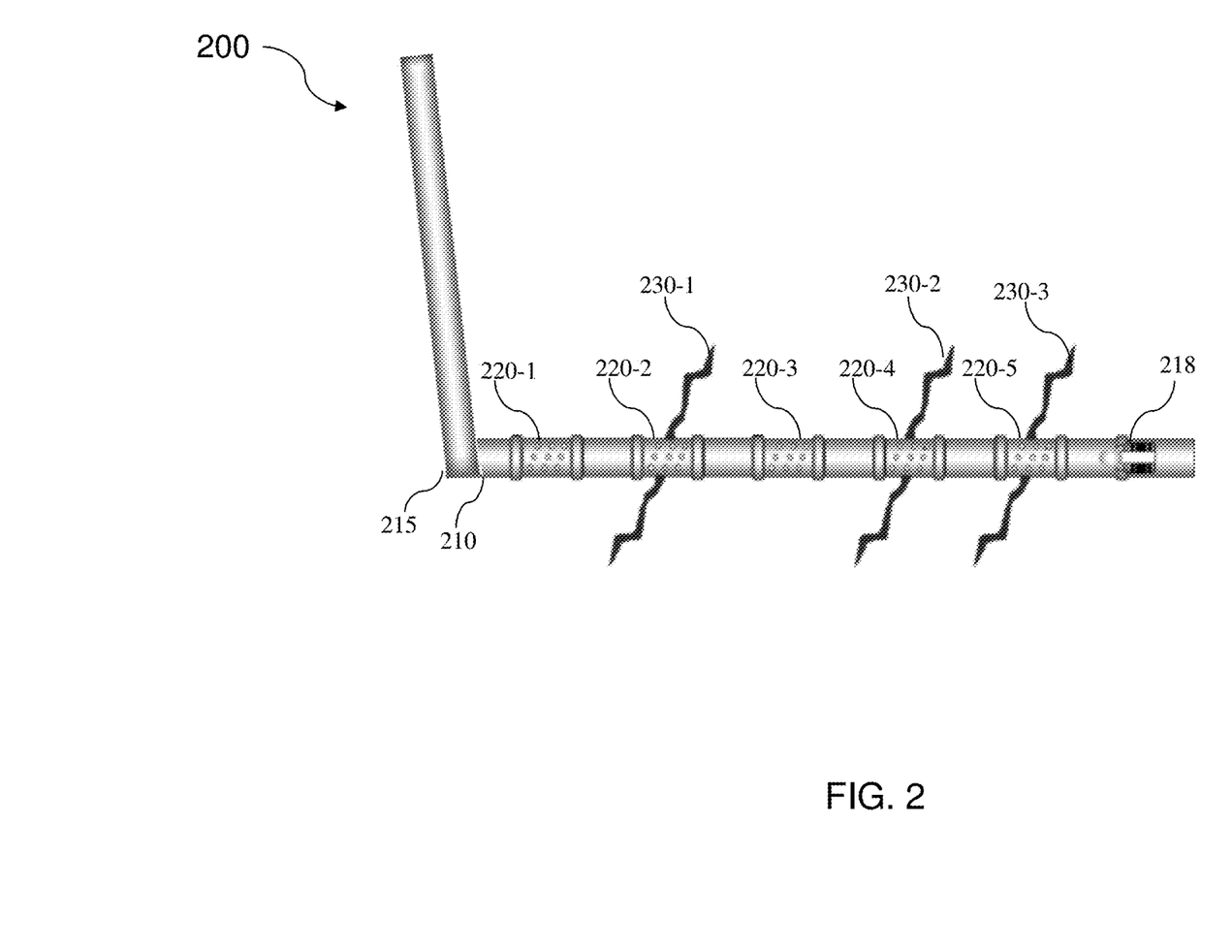
FIG. 2 is an illustration of a diagram of an example HF fluid pipe system.

FIG. 2 is an illustration of a diagram of example HF fluid pipe system 200, demonstrating multiple perforations clusters and multiple fractures. As diverter material is pumped into the subterranean formation, the low resistance flow fractures can accumulate a larger quantity of diverter material thereby increasing the restriction of the flow causing the current or future volume of downhole material pumped into the subterranean formation to be more evenly distributed amongst the active fractures. HF fluid pipe system 200 includes a fluid pipe 210, with a bottom-hole assembly (BHA) 218. BHA 218 can be an end cap or BHA 218 can include one or more tools and sensors. Fluid pipe 210 has a heel 215 where the fluid pipe 210 turns to an approximate horizontal orientation from the original wellbore orientation.

Fluid pipe 220 is capable of providing a path for downhole material, such as diverter material, proppant, clean HF fluid, and carrier fluid, to be pumped from a surface location to a location within the HF wellbore. Fluid pipe 210 includes a perforation cluster 220-1, a perforation cluster 220-2, a perforation cluster 220-3, a perforation cluster 220-4, and a perforation cluster 220-5, collectively identified as perforation clusters 220. Fewer or additional perforation clusters 220 can be part of fluid pipe 210. All, some, or none, of perforation clusters 220 can include a HF fluid pressure gauge, and one or more of the perforation clusters can be active. When HF fluid pressure gauge information is not available at a specific perforation cluster 220, a reference location can be utilized with an offset algorithm to the specific perforation cluster 220. Perforation cluster 220-1 can be identified as the first perforation cluster, e.g., nearest the heel 215, and can be utilized as the reference location in the offset algorithm.

Proximate fluid pipe 210, and extending into the surrounding subterranean formations, is a fracture 230-1, a fracture 230-2, and a fracture 230-3, collectively, fractures 230. Fewer or additional fractures 230 can be part of the subterranean formation. In addition, the orientation of fractures 230 can vary as to what is shown. The number of fractures 230 does not need to match the number of perforation clusters 220.

Figure 3:
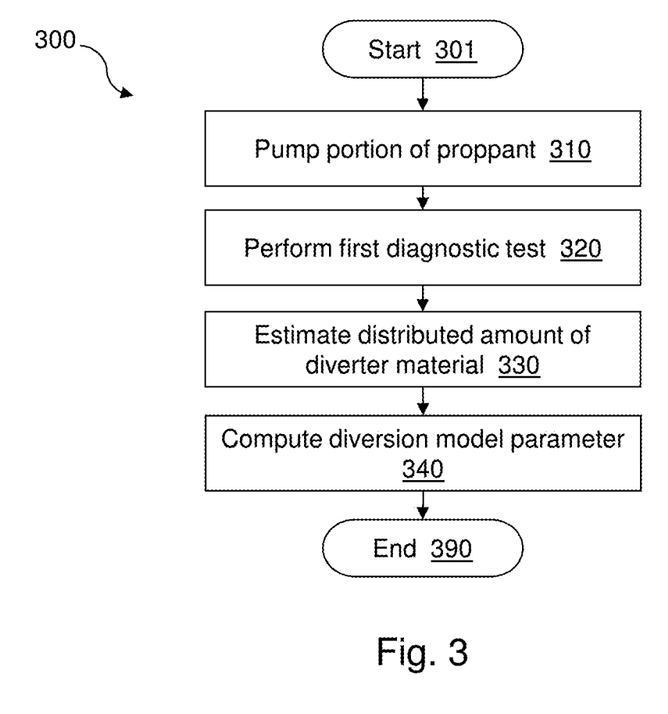
FIG. 3 is an illustration of a flow diagram of an example calibration method to calibrate a diversion model.
Figure 5:
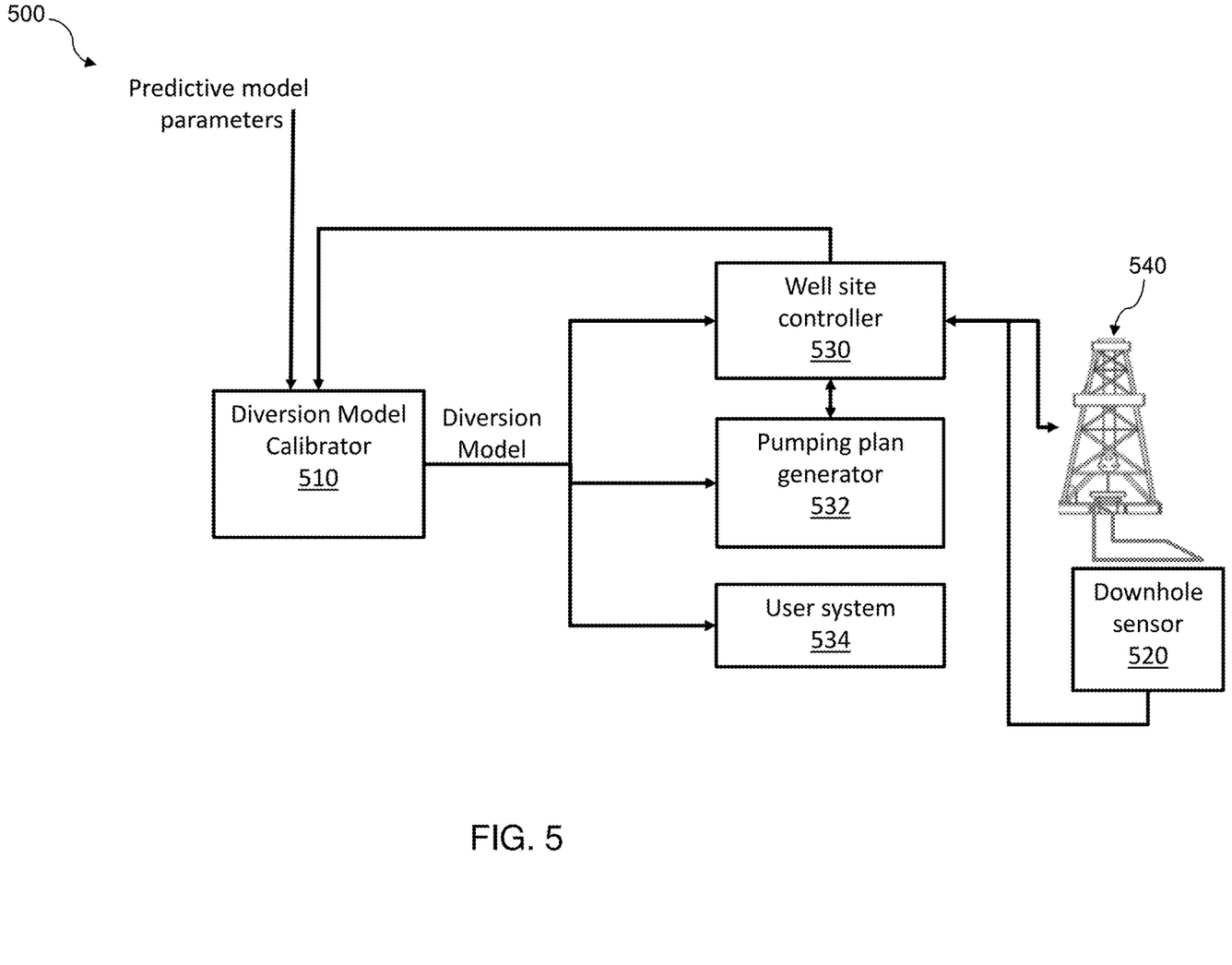
FIG. 5 is an illustration of a block diagram of an example diversion model calibration system.

FIG. 3 is an illustration of a flow diagram of an example calibration method 300. Calibration method 300 computes a calibration for a diversion model using a controlled testing process, and can be executed more than once with the same or different input parameters to improve the calibration accuracy. The diversion model is a physics-based diversion model which characterizes the diversion impact as an augmentation of the tortuosity parameter of the friction HF fluid pressure loss in the NWB zone. The model used herein uses a parameter for the $L_{NWB}$, which is generally not known. Calibration method 300 can be carried out by a computer system capable of directing a controlled diverter material test and receiving downhole HF fluid pressure and HF fluid flow rate parameters, and executing the algorithms described herein, for example, the diversion model calibrator as shown in FIG. 5.

Calibration method 300 starts at a step 301 and proceeds to a step 310 where a portion of the proppant is pumped into the wellbore. The treatment stage plan can typically specify an amount of proppant that should be pumped into the wellbore and at what times during the treatment stage. This process will utilize a portion of the planned proppant amount, such as 30.0% of the total, though other amounts can be utilized, such as 20.0% to 70%. The amount of proppant pumped into the wellbore should be sufficient to cause a measurable difference at the perforation clusters. The measurable difference can be the proppant flow rate and proppant pressure at the active perforation clusters. The HF fluid flow rate and HF fluid pressure parameters can be received from one or more devices and well site equipment, such as a well site controller, surface diagnostic sensors (for example, HF fluid pressure and flow rate gauges), downhole diagnostic sensors (for example, DAS and HF fluid pressure and flow rate gauges), and other well site equipment.

In a step 320, a first diagnostic test can be performed to determine a first tortuosity parameter for each of the active perforation clusters. Prior to the diagnostic test, the wellbore location can be flushed with clean HF fluid, e.g., HF fluid with that does not contain additives, proppants, chemicals, solids, and other material. This can improve the results from the diagnostic test since the additives may change how the HF fluid reacts and is absorbed by the proximate fractures, as well as cause sand erosion and other wellbore detriments.

When using the HF fluid flow rate step test, three or more changes or adjustments to the HF fluid flow rate as pumped from a surface location. Typically, a step-down algorithm is used for the HF fluid flow rate step test, though a step-up algorithm and other algorithms can also be utilized. The first tortuosity parameter can be computed using the detected variation of HF fluid pressure and HF fluid flow rate as measured at each of the active perforation clusters.

In a step 330, an estimation algorithm can be utilized to determine the amount of diverter material distributed to each of the active perforation clusters. The algorithm begins with pumping a quantity of diverter material into the wellbore, such as 100 pounds. Other quantities of diverter material can be used, such as 5.0 to 20.0 pounds of diverter material for each of the active perforation clusters, though other amounts can be utilized. The amount of diverter material to use should be sufficient to produce a measurable variation of carrier fluid pressure or carrier fluid flow rate at one or more of the active perforation clusters.

The diverter material is pumped into the wellbore using a measured quantity of carrier fluid. Carrier fluid, which can be the clean HF fluid or another fluid, can be used to eliminate affects caused by other additives, such as proppants, chemicals, and solids. The carrier fluid is typically what is measured at each active perforation cluster. The amount of carrier fluid received at each active perforation cluster can be used as an estimate of the amount of diverter material distributed to each of the respective active perforation clusters.

In a step 340, a diversion model parameter, such as $L_{NWB}$, can be computed. Step 340 can perform a second diagnostic test to derive a second tortuosity parameter for each of the active perforation clusters, following the same, similar, or different algorithm as used for the first diagnostic test. The $L_{NWB}$ algorithm can utilize the first tortuosity parameters as determined in step 320 and the corresponding second tortuosity parameters as determined in this step 340, where the correspondence uses the tortuosity parameters from the same active perforation cluster.

One or more of the $L_{NWB}$ computed for each of the active perforation clusters can be utilized to compute the $L_{NWB}$ for the wellbore. The diversion model can then be calibrated using the $L_{NWB}$ for the wellbore. Method 300 ends at a step 390.

Figure 4:
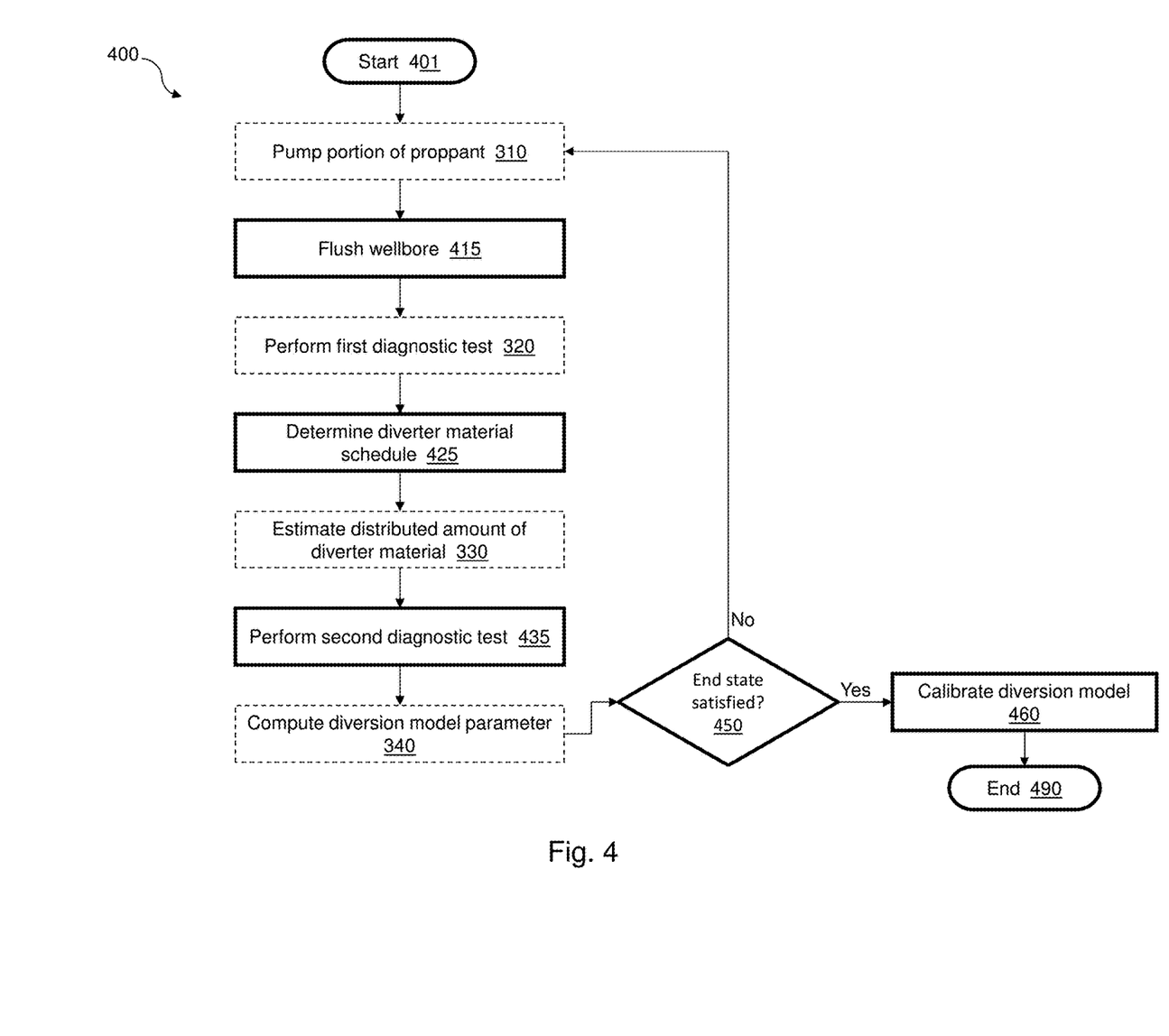
FIG. 4 is an illustration of a flow diagram of an example repeating calibration method to calibrate a diversion model.

FIG. 4 is an illustration of a flow diagram of an example repeating calibration method 400. Repeating calibration method 400 is similar to calibration method 300, with the differences highlighted below. Repeating calibration method 400 computes a calibration, such as the $L_{NWB}$ for the wellbore, to be applied to the diversion model. Repeating calibration method 400 can be carried out by a computer system capable of directing a controlled diverter material test and receiving downhole HF fluid pressure and HF fluid flow rate parameters, and executing the algorithms described herein, for example, the computing system shown as diversion model calibrator in FIG. 5.

Repeating calibration method 400 starts at a step 401 and proceeds through the steps as is described in calibration method 300 until step 310. At step 310, the repeating calibration method 400 proceeds to a step 415 where the wellbore is flushed with clean HF fluid. The clean HF fluid has zero or near zero proppant concentration so that proppant particles can be removed from the fluid flow path of the wellbore to avoid affecting the tortuosity parameters and perforation erosion due to sand erosion and other interferences and disturbances. Repeating calibration method 400 proceeds to step 320 and is performed as described in calibration method 300. From step 320, repeating calibration method 400 proceeds to a step 425.

Step 425, determines the diverter schedule. The diverter material can vary as to concentration, total quantity, type of diverter material, and timing of the drop into the carrier fluid. The number of active perforation clusters, the length of the fluid pipe and wellbore, as well as downhole parameters (for example, temperature), other wellbore parameters, and subterranean formation parameters (for example, mineralogical properties), and other parameters can be used to determine the diverter schedule. Proceeding to step 330, the amount of diverter material distributed to the active perforation clusters can be estimated as described in calibration method 300.

From step 330, repeating calibration method 400 proceeds to a step 435, where the second diagnostic test is conducted following the same, similar, or different algorithm as used in step 320. Proceeding to step 340, the $L_{NWB}$ can be computed. Repeating calibration method 400 proceeds to a decision step 450 where an end state is checked against one or more end state parameters. The end state parameters can be a number of iterations, an amount of elapsed time, the $L_{NWB}$ for the active perforation clusters are within a satisfactory difference from one another, the $L_{NWB}$ for the wellbore is within a satisfactory difference from a previously computed $L_{NWB}$, and other end state conditions. If the resultant of decision step 450 is 'No', repeating calibration method 400 proceeds to step 310. In an alternate aspect, the calibration method 400 can utilize a shorter process by proceeding to step 425 where additional diverter material can be dropped and new $L_{NWB}$ computed after the diagnostic test is performed. If the resultant of decision step 450 is 'Yes', repeating calibration method 400 proceeds to step 460.

Step 460 calibrates the diversion model using the diverter schedule determined in step 425 and the $L_{NWB}$ parameters computed in step 340. The calibrated diversion model can then be utilized by a treatment stage plan to direct the treatment stage operations. Proceeding from step 460, repeating calibration method 400 ends at a step 490.

FIG. 5 is an illustration of a block diagram of an example diversion model calibration system 500. Diversion model calibration system 500 is configured to receive predictive model parameters, such as wellbore parameters (for example, length and orientation), subterranean formation parameters (such as mineralogical parameters), diversion model parameters, diverter schedules, and other parameters for the predictive model. In addition, diversion model calibration system 500 is configured to receive sensor data from the wellbore, and is configured to generate a calibration for the diversion model. Diversion model calibration system 500 includes a diversion model calibrator 510 and one or more downhole sensors 520 located within a well system 540. The calibrated diversion model can be used by various systems, components, and users. Diversion model calibration system 500 includes three example uses of the calibrated diversion model, a well site controller 530, a pumping plan generator 532, and a user system 534. Pumping plan generator 532 can generate a pumping plan for a treatment stage and provide that information to well site controller 530 of well system 540.

In an alternative aspect, pumping plan generator 532 can be part of well site controller 530. Alone, or in combination with a calibrated diversion model, well site controller 530 can execute HF treatment stages for well system 540. In addition, well system 540 can provide information, such as HF treatment data, HF fluid pressure, HF fluid flow rate, HF fluid composition, and other well system data to a well site parameter collector (not shown), which can be well site controller 530. Well site parameter collector or well site controller 530 can provide this information as parameter inputs to diversion model calibrator 510.

Diversion model calibrator 510 is configured to receive the predictive model parameters and downhole sensor data, such as from downhole sensors 520. The predictive model parameters can be received from one or more of well site equipment, a data store, a cloud storage, a data center, server, memory, hard drive, and other computing storage systems, or a combination of such computing storage systems located proximate to or a distance from diversion model calibrator 510.

Inputs into the predictive model can be received directly from sensors or through the well site controller 530, such as diagnostic sensors located at the surface of the well site (for example, HF fluid pressure and HF fluid flow rate gauges, and downhole material composition analyzers) and downhole diagnostic sensors located within the wellbore (for example, bottom hole HF fluid pressure gauges and DAS). Downhole sensors 520 are one or more of the diagnostic sensors located within the wellbore of well system 540. In some aspects, one or more of the perforation clusters on the fluid pipe in the well system 540 can have one or more associated downhole sensors 520.

Diversion model calibrator 510, upon receiving the predictive model and other parameter inputs, can, at prescribed times, execute the algorithms and processes described herein, such as direct the performance of the controlled test process. Depending on the parameters available, diversion model calibrator 510 can select a diverter schedule. The calibration algorithm can be executed more than one time to determine a best fit diverter schedule that best satisfies the targeted goals of the treatment stage. The best fit diverter schedule can be output and used within a diversion model for the treatment stage.

Diversion model calibrator 510 can be a processor or electronic circuitry configured to perform the functionalities described herein. In one example, diversion model calibrator 510 is a set of instructions running on a computing system, such as an application, function, routine, library, or a portion of an application, that direct the operation of the computing system. In some examples, diversion model calibrator 510 is a combination of processors and operating instructions. In an alternate aspect, diversion model calibrator 510 can be part of well site controller 530, pumping plan generator 532, or a combination thereof.

Once the best fit diverter schedule is generated, diversion model calibrator 510 can communicate the diverter schedule, modified diversion model, and associated parameters to another system. The receiving systems can be well site controller 530, pumping plan generator 532, user system 534, and other computer systems or well site equipment.

Pumping plan generator 532 can use the received diversion model to modify the treatment stage pumping plan, such as adjusting the concentration, HF fluid flow rate, and release timing of the diverter material into the wellbore. The well site controller 530 can use the diversion model to update an executing treatment stage to make real-time or near real-time adjustments. The user system 534 can use the diversion model for the above uses and other uses as well where user interaction and decision making is used for further processing. The user system 534 can be a display, monitor, printer, smartphone, tablet, laptop, server, and other systems and devices capable of receiving the recommended modification parameters and allowing user access to the diversion model and diverter schedule.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

Aspects disclosed herein include:

A. A method to calibrate a diversion model for a treatment stage of a HF well site, including: (1) pumping a portion of a proppant amount into a wellbore of the HF well site, using a plan for the treatment stage, (2) performing a first diagnostic test to determine a first NWB flow resistance parameter for each of one or more active perforation clusters, using a HF fluid pressure variation and a HF fluid flow rate variation for each of the active perforation clusters, (3) estimating an amount of a diverter material distributed to each of the active perforation clusters using a quantity of a carrier fluid received at each of the respective active perforation clusters, wherein the carrier fluid carries the diverter material and is pumped into the wellbore, and (4) computing a diversion model parameter of the NWB for each of the active perforation clusters using the respective first NWB flow resistance parameter and a corresponding second NWB flow resistance parameter, wherein each of the corresponding second NWB flow resistance parameters are derived from a second diagnostic test.

B. A system to calibrate a diversion model for a treatment stage of a HF well site including: (1) a downhole diagnostic sensor, operable to collect one or more of a HF fluid pressure parameter and a HF fluid flow rate parameter, and located in the HF well site, and (2) a diversion model calibrator, operable to compute a NWB length of a perforation cluster in the wellbore using parameters received from the downhole diagnostic sensor, provide pumping parameters where the pumping parameters utilize a diverter schedule, and calibrate the diversion model using each NWB length.

C. A computer program product having a series of operating instructions stored on a non-transitory computer-readable medium that directs a data processing apparatus when executed thereby to perform operations to calibrate a diversion model for a treatment stage of a HF well site, operations including: (1) directing a pump system to pump a portion of a proppant amount into a wellbore of the HF well site, using a plan for the treatment stage, (2) determining a first NWB flow resistance parameter using a result of a first diagnostic test, for each of one or more active perforation clusters, using a HF fluid pressure variation and a HF fluid flow rate variation for each of the active perforation clusters, (3) estimating an amount of a diverter material distributed to each of the active perforation clusters using a quantity of a carrier fluid received at each of the respective active perforation clusters, wherein the carrier fluid carries the diverter material and is pumped into the wellbore, and (4) computing a diversion model parameter of a NWB zone for each of the active perforation clusters using the respective first NWB flow resistance parameter and a corresponding second NWB flow resistance parameter, wherein each of the corresponding second NWB flow resistance parameters are derived from a second diagnostic test.

Each of aspects A, B, and C can have one or more of the following additional elements in combination: Element 1: wherein the first diagnostic test is one of a fluid flow rate step test, a mini-frac test, and diagnostic fracture injection test, and the second diagnostic test is one of a fluid flow rate step test, a mini-frac test, and diagnostic fracture injection test. Element 2: wherein the wellbore is flushed with clean HF fluid prior to performing the first rate step test. Element 3: wherein the diversion model parameter is one or more of formation elastic parameters, NWB flow resistance parameters, and NWB dimension parameters. Element 4: wherein the diverter material is a diverter agent that impacts a fluid flow distribution among perforation clusters, and where the diverter agent is one or more of a particulate diverter, diverter pod, and fiber-based diverter. Element 5: calibrating the diversion model using the diversion model parameter for each of the active perforation clusters. Element 6: wherein the calibrating utilizes an arithmetic mean using each length parameter. Element 7: wherein the calibrating utilizes a closest match to a diversion response for the active perforation clusters. Element 8: executing one or more times the pumping, the performing, the estimating, and the computing. Element 9: wherein and the calibrating further utilizes each length parameter from each computing. Element 10: wherein the estimating for each executing utilizes one or more of a different diverter material concentration in the carrier fluid, a different diverter material seating rate, and a different timing to drop the diverter material. Element 11: wherein the treatment stage is a first treatment stage and one or more of the executing occurs in a second treatment stage. Element 12: wherein the first diagnostic test and the second diagnostic test utilize a HF fluid flow rate step test and are performed using at least three distinct HF fluid flow rates and utilizes clean HF fluid. Element 13: wherein the portion of the proppant amount is 20.0% to 70.0% of the total amount specified for the treatment stage. Element 14: wherein the portion of the proppant amount is 30.0%. Element 15: wherein a quantity of the diverter material carried by the carrier fluid is 5.0 to 20.0 pounds multiplied by a count of the active perforation clusters. Element 16: wherein the quantity of the diverter material is 100 pounds. Element 17: a well site controller, operable to direct a pumping plan of the treatment stage using the pumping parameters. Element 18: a pumping plan generator, operable to modify a pumping plan of the treatment stage using the pumping parameters, and communicate with the well site controller. Element 19: wherein the diversion model calibrator repeats executions one or more times utilizing one or more diverter schedules. Element 20: executing one or more times the directing, the determining, the estimating, and the computing operations, and the calibrating further utilizes each diversion model parameter from each computing operation. Element 21: wherein the calibrating utilizes one of an arithmetic using each diversion model parameter, and a closest match to a diversion response for the active perforation clusters.

What is claimed is:

1. A method to calibrate a diversion model for a treatment stage of a hydraulic fracturing (HF) well site, comprising:
   pumping a portion of a proppant amount into a wellbore of the HF well site, using a plan for the treatment stage, wherein the portion of the proppant amount is greater than zero;
   performing a first diagnostic test to determine a first near-wellbore (NWB) flow resistance parameter for each of one or more active perforation clusters, using a HF fluid pressure variation and a HF fluid flow rate variation for each of the active perforation clusters;
   estimating an amount of a diverter material distributed to each of the active perforation clusters using a quantity of a carrier fluid received at each of the respective active perforation clusters, wherein the carrier fluid carries the diverter material and is pumped into the wellbore;

computing a diversion model parameter of a NWB zone for each of the active perforation clusters using the respective first NWB flow resistance parameter, the amount of diverter material distributed, and a corresponding second NWB flow resistance parameter, wherein each of the corresponding second NWB flow resistance parameters are derived from a second diagnostic test; and modifying the treatment stage using a calibrated diversion model, wherein the calibrated diversion model is generated using the diversion model that is calibrated using at least one of the diversion model parameters, wherein the at least one of the diversion model parameters includes at least a NWB length parameter.

2. The method as recited in claim 1, wherein the first diagnostic test is one of a fluid flow rate step test, a mini-frac test, and diagnostic fracture injection test, and the second diagnostic test is one of a fluid flow rate step test, a mini-frac test, and diagnostic fracture injection test.

3. The method as recited in claim 1, wherein the wellbore is flushed with clean HF fluid prior to performing the first diagnostic test.

4. The method as recited in claim 1, wherein the diversion model parameter is one or more of formation elastic parameters, NWB flow resistance parameters, and NWB dimension parameters.

5. The method as recited in claim 1, wherein the diverter material is a diverter agent that impacts a fluid flow distribution among perforation clusters, and where the diverter agent is one or more of a particulate diverter, diverter pod, and fiber-based diverter.

6. The method as recited in claim 1, further comprises:
calibrating the diversion model using the diversion model parameter for each of the active perforation clusters.

7. The method as recited in claim 6, wherein the calibrating utilizes an arithmetic mean using each length parameter.

8. The method as recited in claim 6, wherein the calibrating utilizes a closest match to a diversion response for the active perforation clusters.

9. The method as recited in claim 6, further comprises:
executing one or more times the pumping, the performing, the estimating, and the computing, wherein the calibrating further utilizes each length parameter from each computing.

10. The method as recited in claim 9, wherein the estimating for each executing utilizes one or more of a different diverter material concentration in the carrier fluid, a different diverter material seating rate, and a different timing to drop the diverter material.

11. The method as recited in claim 9, wherein the treatment stage is a first treatment stage and one or more of the executing occurs in a second treatment stage.

12. The method as recited in claim 1, wherein the first diagnostic test and the second HF diagnostic test utilize a HF fluid flow rate step test and are performed using at least three distinct HF fluid flow rates and utilizes clean HF fluid.

13. The method as recited in claim 1, wherein the portion of the proppant amount is 20.0% to 70.0% of the total amount specified for the treatment stage.

14. The method as recited in claim 13, wherein the portion of the proppant amount is 30.0%.

15. The method as recited in claim 1, wherein a quantity of the diverter material carried by the carrier fluid is 5.0 to 20.0 pounds multiplied by a count of the active perforation clusters.

16. The method as recited in claim 15, wherein a range of active perforation clusters is 5 to 20 and where the calculation of the quantity of the diverter material is approximately 100 pounds.

17. A system to calibrate a diversion model for a treatment stage of a hydraulic fracturing (HF) well site, comprising:
a downhole diagnostic sensor collecting one or more of a HF fluid pressure parameter and a HF fluid flow rate parameter, and located in the HF well site; and
a diversion model processor, operable to compute a near-wellbore (NWB) length of a perforation cluster in the wellbore using parameters received from the downhole diagnostic sensor, calibrate the diversion model to generate a calibrated diversion model using the NWB length and a proppant in an amount greater than zero, provide pumping parameters for the treatment stage where the pumping parameters are determined using a diverter schedule and the calibrated diversion model.

18. The system as recited in claim 17, further comprising:
a well site controller having one or more processors, operable to direct a pumping plan of the treatment stage using the pumping parameters.

19. The system as recited in claim 18, further comprising:
a pumping plan processor, operable to modify a pumping plan of the treatment stage using the pumping parameters, and communicate with the well site controller.

20. The system as recited in claim 17, wherein the diversion model processor repeats executions one or more times utilizing one or more diverter schedules.

21. A computer program product having a series of operating instructions stored on a non-transitory computer-readable medium that directs a data processing apparatus when executed thereby to perform operations to calibrate a diversion model for a treatment stage of a hydraulic fracturing (HF) well site, the operations comprising:
directing a pump system to pump a portion of a proppant amount into a wellbore of the HF well site, using a plan for the treatment stage, wherein the portion of the proppant amount is greater than zero;
determining a first near-wellbore (NWB) flow resistance parameter using a result of a first diagnostic test, for each of one or more active perforation clusters, using a HF fluid pressure variation and a HF fluid flow rate variation for each of the active perforation clusters;
estimating an amount of a diverter material distributed to each of the active perforation clusters using a quantity of a carrier fluid received at each of the respective active perforation clusters, wherein the carrier fluid carries the diverter material and is pumped into the wellbore;
computing a diversion model parameter of a NWB zone for each of the active perforation clusters using the respective first NWB flow resistance parameter, the amount of diverter material distributed, and a corresponding second NWB flow resistance parameter, wherein each of the corresponding second NWB flow resistance parameters are derived from a second diagnostic test; and
modifying the treatment stage using a calibrated diversion model, wherein the calibrated diversion model is generated using the diversion model that is calibrated using at least one of the diversion model parameters, wherein the at least one of the diversion model parameters includes at least a NWB length parameter.

22. The computer program product as recited in claim 21, further comprising:
calibrating the diversion model using the diversion model parameter for each of the active perforation clusters.

23. The computer program product as recited in claim 22, further comprising:
executing one or more times the directing, the determining, the estimating, and the computing operations, and the calibrating further utilizes each diversion model parameter from each computing operation.

24. The computer program product as recited in claim 22, wherein the calibrating utilizes one of an arithmetic mean using each diversion model parameter, and a closest match to a diversion response for the active perforation clusters.

* * * * *

UNITED STATES PATENT AND TRADEMARK OFFICE
CERTIFICATE OF CORRECTION

PATENT NO. : 11,449,645 B2  
APPLICATION NO. : 16/564937  
DATED : September 20, 2022  
INVENTOR(S) : Seyed Omid Razavi et al.

Page 1 of 1

It is certified that error appears in the above-identified patent and that said Letters Patent is hereby corrected as shown below:

In the Specification

In Column 6, Line 15-18, Equation 2, delete:

" $$\alpha_{tort,AD,i} = \frac{\alpha_{tort,BD,i}}{1 - \sqrt{\frac{\pi(1-v^2)}{64 \, E \, \rho_{diverter}^2 \, L_{NWB}^3} \, \alpha_{tort,BD,i} \, m_{diverter,i}}}$$ "

And insert:

-- $$\alpha_{tort,AD,i} = \frac{\alpha_{tort,BD,i}}{1 - \sqrt{\frac{\pi(1-v^2)}{64 \, \mu \, E \, \rho_{diverter}^2 \, L_{NWB}^3} \, \alpha_{tort,BD,i} \, m_{diverter,i}}}$$ --

Signed and Sealed this  
Fourth Day of April, 2023

*Katherine Kelly Vidal*  
Katherine Kelly Vidal  
*Director of the United States Patent and Trademark Office*